US006681374B1

United States Patent
Lee

(10) Patent No.: US 6,681,374 B1
(45) Date of Patent: Jan. 20, 2004

(54) HIT-OR-JUMP METHOD AND SYSTEM FOR EMBEDDED TESTING

(75) Inventor: David Lee, Somerset, NJ (US)

(73) Assignee: Lucent Technologies Inc., Murray Hill, NJ (US)

(*) Notice: Subject to any disclaimer, the term of this patent is extended or adjusted under 35 U.S.C. 154(b) by 612 days.

(21) Appl. No.: 09/589,185

(22) Filed: Jun. 8, 2000

Related U.S. Application Data

(60) Provisional application No. 60/138,398, filed on Jun. 9, 1999.

(51) Int. Cl.[7] .................. G06F 17/50; G06F 19/00; G01R 31/28
(52) U.S. Cl. .................. 716/4; 716/7; 702/118; 703/16; 714/30; 714/724
(58) Field of Search .............. 716/4, 7; 703/16; 702/118, 120; 714/30, 733, 734, 741, 724

(56) References Cited

U.S. PATENT DOCUMENTS

| | | | |
|---|---|---|---|
| 4,914,659 A | | 4/1990 | Erickson .................. 714/38 |
| 5,450,586 A | | 9/1995 | Kuzara et al. .............. 717/124 |
| 5,586,125 A | * | 12/1996 | Warner .................. 714/738 |
| 5,884,082 A | | 3/1999 | Seidel et al. ................ 717/128 |
| 5,909,452 A | * | 6/1999 | Angelotti .................. 714/726 |
| 5,911,059 A | | 6/1999 | Profit, Jr. .................. 703/23 |
| 5,918,037 A | * | 6/1999 | Tremblay et al. .............. 716/2 |
| 6,181,320 B1 | * | 1/2001 | Fredrickson .................. 345/440 |
| 6,209,120 B1 | * | 3/2001 | Kurshan et al. ................ 716/5 |

OTHER PUBLICATIONS

Olson et al., "State assignment for low–power FSM synthesis using genetic local search", Proceedings of the IEEE 1994 Custo Integrated Circuits Conference, May 1, 1994, pp. 140–143.*

Rekleitis et al., "Efficient topological exploration", Proceedings of 1999 IEEE International Conference on Robotics and Automation, May 10, 1999, vol. 1, pp. 676–681.*

* cited by examiner

Primary Examiner—Vuthe Siek
Assistant Examiner—Phallaka Kik

(57) ABSTRACT

This invention presents a new "Hit-or-Jump" system and method for embedded testing of components of communication systems that can be modeled by communicating extended finite state machines. It constructs test sequences efficiently with a high fault coverage. It does not have state space explosion, as is often encountered in exhaustive search, and it quickly covers the system components under test without being "trapped", as is experienced by random walks. The algorithm has been implemented and applied to embedded testing of telephone services in an IN architecture, including the Basic Call Service (ECS) as well as other supplementary services.

13 Claims, 4 Drawing Sheets

FIG. 1
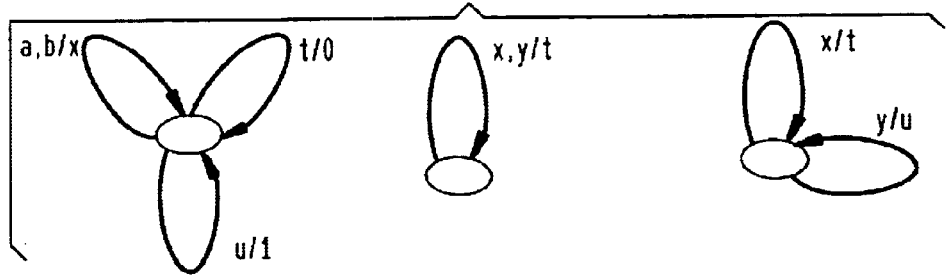
FIG. 2
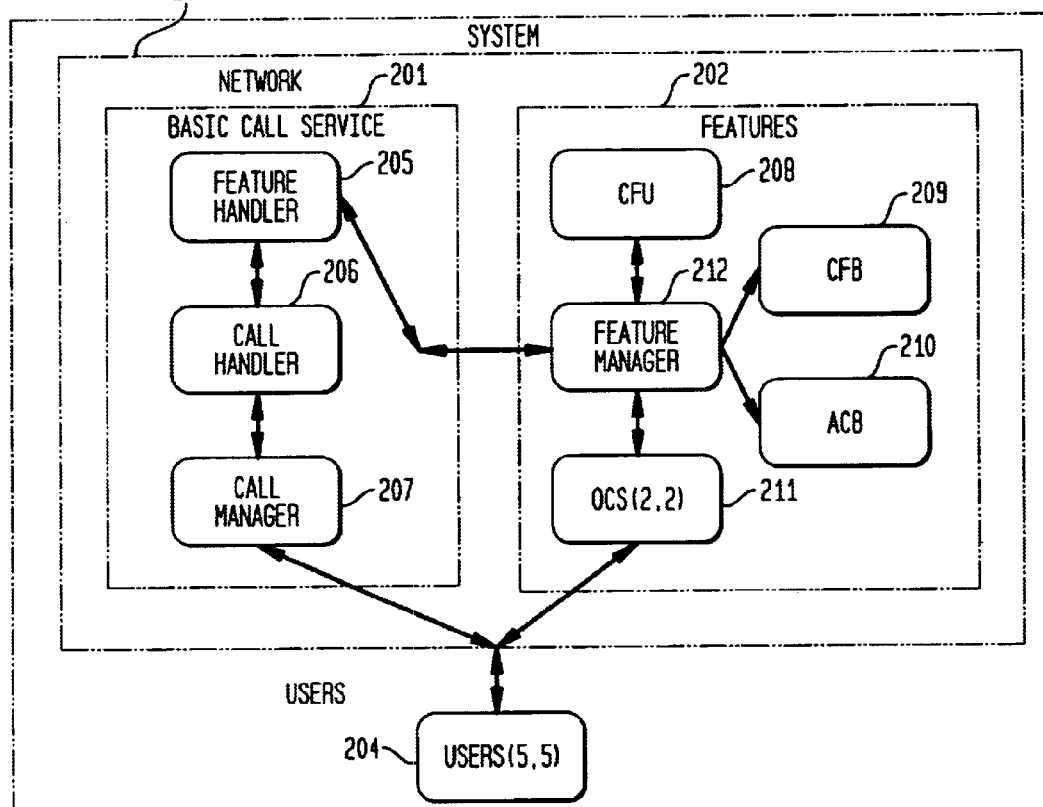
FIG. 3
| LINES | 3098 |
|---|---|
| BLOCKS | 4 |
| PROCESS | 9 |
| PROCEDURES | 12 |
| STATES | 88 |
| SIGNALS | 50 |
| MACRO DEFINITION | 12 |
| TIMERS | 0 |
FIG. 4
| NUMBER OF STATES | 674814 |
|---|---|
| NUMBER OF TRANSITIONS | 2878800 |
| MAXIMUM DEPTH REACHED | 28 |
| DURATION | 43 mn 49 s |
| TRANSITION COVERAGE RATE | 46.07% |
| STATES COVERAGE RATE | 70.37% |

FIG. 5

| | |
|---|---|
| STOP IF  OUTPUT CONTINUE FROM BLACKLIST | #1 |
| OR  OUTPUT CLEAR_CALL FROM BLACKLIST | #2 |
| OR  OUTPUT READY FROM BLACKLIST | #3 |
| OR  INPUT ADD_LIST_ELMNT TO BLACKLIST AND OUTPUT FEATURE_OP_OK FROM BLACKLIST | #4 |
| OR  TRANS BLACKLIST: FROM_UPDATE_INPUT_CUT_CONNECTION | #5 |
| OR  INPUT ADD_LIST_ELMNT TO BLACKLIST AND OUTPUT MSG_INFO FROM BLACKLIST | #6 |

FIG. 6

| | STOP #1 | STOP #2 | STOP #3 | STOP #4 | STOP #5 | STOP #6 |
|---|---|---|---|---|---|---|
| NUMBER OF STATES | 12 | 66 | 96 | 4 | 5 | 104 |
| NUMBER OF TRANSITIONS | 11 | 65 | 95 | 3 | 4 | 103 |
| MAX DEPTH REACHED | 11 | 50 | 50 | 3 | 4 | 50 |
| DURATIONS (SECONDS) | 2.5 | 4.4 | 6.7 | 8.6 | 10.4 | 11.1 |

FIG. 7

```
(50,"dial_tone/dialed[2]",51)
(51,"dialed[2]/net_trigger[addressed,1,2]",52)
(52,"net_trigger[addressed,1,2]/invoke[ocs,1,2,user(1),addressed]",53)
(53,"invoke[ocs,1,2,user(1),addressed]/invoke[ocs,1,2,user(1),addressed]",54)
(54,"invoke[ocs,1,2,user(1),addressed]/continue",55)
(55,"continue/continue",56)
```

FIG. 8

```
(137,"line_free/user_ack",138)
(138,"user_ack/cm_ack", 139)
(139,"cm_ack/handler_exit[call_handler(4)]",140)
(140,"handler_exit[call_handler(4)]/schedule_user[true]",141)
(141,"schedule_user[true]/offhook",142)
(142,"offhook/dial_tone",143)
(143,"dial_tone/feature_op[ocs.updat]",144)
(144,"feature_op[ocs.updat]user_trigger[ocs.updat.1.1]",145)
(145,"user_trigger[ocs.updat.1.1]update[ocs.1.user(1)]",146)
(146,"update[ocs,1,user(1)]/update[ocs,1,user(1)]",147)
(147",update[ocs,1,user(1)]/ready",148)
```

FIG. 9

| MODULE | OCS | | | |
|---|---|---|---|---|
| MODE | DFS | BFS | MERGE | RWALK |
| DEPTH | 50 | 50 | 50 | |
| STOPS | 6 | 6 | 6 | 6 |
| SEQUENCE | 834 | 150 | 167 | 1402 |
| JUMPS | 18 | 1 | 0 | |

FIG. 10

| MODULE | CFU | | | |
|---|---|---|---|---|
| MODE | DFS | BFS | MERGE | RWALK |
| DEPTH | 100 | 100 | 100 | |
| STOPS | 6 | 6 | 6 | 6 |
| SEQUENCE | DEADLOCKS | 137 | 261 | 586 |
| JUMPS | <70 | 0 | 0 | |

FIG. 11

| MODULE | INRES | | | |
|---|---|---|---|---|
| MODE | DFS | BFS | MERGE | RWALK |
| DEPTH | 100 | 100 | 100 | |
| STOPS | 4 | 4 | 4 | 4 |
| SEQUENCE | 368 | 36 | 101 | 6856 |
| JUMPS | 4 | 0 | 0 | |

FIG. 12

| MODULE | INRES | | | |
|---|---|---|---|---|
| MODE | DFS | BFS | MERGE | RWALK |
| DEPTH | 100 | 100 | 100 | |
| STOPS | 5 | 5 | 5 | 5 |
| SEQUENCE | STOPPED | 44 | 186 | STOPPED |
| JUMPS | | 0 | 0 | |

HIT-OR-JUMP METHOD AND SYSTEM FOR EMBEDDED TESTING

RELATED APPLICATIONS

This patent application claims priority from provisional application serial No. 60/138,398, filed Jun. 9, 1999, titled "Hit-Or-Jump: An Algorithm For Embedded Testing With Applications To IN Services" (David Lee, case 7; 22 pages, 4 sheets of drawings [informal])

BACKGROUND OF THE INVENTION

1. Field of the Invention

The present invention relates to embedded testing of components in a system that can be modeled through extended finite state machines.

2. Description of the Prior Art

With the advanced computer technology and the increasing demand from the users for sophisticated services, communication protocol systems are becoming more complex, yet less reliable. Conformance testing, which ensures correct protocol implementations, has become indispensable for the development of reliable communication systems. Traditional testing methods tend to test these systems as a whole or alternately test their components in isolation. Testing these systems as a whole becomes difficult due to the formidable size of the systems. Furthermore, testing system components in isolation may not be always feasible due to the interactions among the individual system components. Typically, the tester does not have a direct access to the component under test; access is obtained through other components of the system. As a result, Embedded testing or testing in context has become one of the main focuses of conformance testing research in recent years. The goal of embedded testing is to test whether an implementation of a system component conforms to its specification in the context of other components. If control and observation are applied through one or more implementations that are above the protocol to be tested, the testing methods are called "embedded."

Different approaches for embedded testing are currently in use. These approaches are based on (1) fault models, (2) on reducing the problem to testing of components in isolation, (3) on test suite minimization, (4) on fault coverage, and (5) on the test of systems with semi-controllable and uncontrollable interfaces. Most of these approaches resort to reachability graphs to model the joint behaviors of all the system components. Unfortunately, the implementation of these approaches is plagued by state space explosion, as well as random walk errors.

The problem of random walk remains prevalent under current systems. For example, for a given system component, there is generally a need to test all the transitions or certain boundary values of system variables. Conventionally, a reachability graph is constructed, which is the Cartesian product of all the system components involved. Next, a test is derived that covers all the pre-specified parts of the component under test. Unfortunately, this exhaustive search technique is often impractical; it is impossible to construct a reachability graph for practical systems due to the state space explosion. To avoid this problem random walks have been proposed. At any moment, it is only necessary to keep track of the current states of all the components and determine the next step of test at random. This approach avoids the state space explosion but it may repeatedly test covered parts and take a long time to move on to the untested parts.

Furthermore, a random walk may become "trapped" at a certain part of the component under test or in a small neighborhood. Also, random walks have a low probability of crossing a "narrow bridge" to test the parts beyond the bridge, and may also miss unmarked transitions, even if they are nearby (more than one step from the current node). Finally, the great reliance on reachability graphs restricts space requirements in testing, and is dependent on the system under consideration.

SUMMARY OF THE INVENTION

The present invention, referred to as "Hit-or-Jump" provides a more efficient and accurate modeling environment through the use of communicating extended unit state machines (CEFSM). Specifically, a new method and system is disclosed for embedded testing of CEFSM's. The CEFSM model can also be easily adapted to other mathematical models such as Transition Systems, Labeled Transition Systems, and Petri Nets.

Specifically, the present invention tests pre-specified parts of a system component that is embedded in a complex communication system. The pre-specified parts are determined by practical needs or by system certification requirements. Thus, all the transitions or certain boundary values of system variables may be tested for a given system component. Under the "Hit-or-Jump" method and system, a local search is conducted from the current state in a neighborhood of the reachability graph. If an untested part is found (a "Hit"), that part is tested, and the process continues from that point. Otherwise, a subsequent random move is made to the frontier of the neighborhood searched ("Jump"), where the process then continues. This procedure avoids the construction of a complete system reachability graph. Furthermore, the space required is determined by the user, and it is independent of the systems under consideration. While a random walk may get "trapped" at certain part of the component under test, the disclosed method and system is designed to "jump" out of the trap and pursue the exploration further.

In a preferred embodiment, the Hit-or-Jump method is applied to the embedded testing of services on a telephone network. The examples given below typify the invention utilized in a system using the signaling data link (SDL) language. The telephone services associated with the invention appear in an Intelligent Network (IN) architecture with Basic Call Services (BCSs). In addition to BCS, five other services are included: Originating Call Screening (OCS), Terminating Call Screening (TCS), Call Forward Unconditional (CFU), Call Forward on Busy Line (CBL) and Automatic Call Back (ACB).

DESCRIPTION OF THE FIGURES

FIG. 1 illustrates the extended finite state machine (EFSM) intercommunication according to the present invention.

FIG. 2 illustrates a global architecture of the present invention

FIG. 3 illustrates the metrics of the service specification

FIG. 4 illustrates the metrics of the complete specification after a manual stop of the search/simulation.

FIG. 5 illustrates stop conditions of the blacklist process according to the present invention.

FIG. 6 illustrates stop conditions of the OCS module according to the present invention.

FIG. 7 illustrates the obtained test sequences of transitions during invocation of services according to the present invention.

FIG. 8 illustrates a series of transitions that allow the transition of the embedded module to be reached in the case of a stop output ready according to the present invention.

FIG. 9 illustrates the metrics of a module OCS according to the present invention.

FIG. 10 illustrates the metrics of a module CFU according to the present invention.

FIG. 11 illustrates a test sequence of "Hit-or-Jump" applied to the process responder of an INRES protocol according to the present invention.

FIG. 12 illustrates a second test sequence of "Hit-or-Jump" applied to the process responder of an INRES protocol according to the present invention.

DESCRIPTION OF THE EMBODIMENTS

Figure 13:
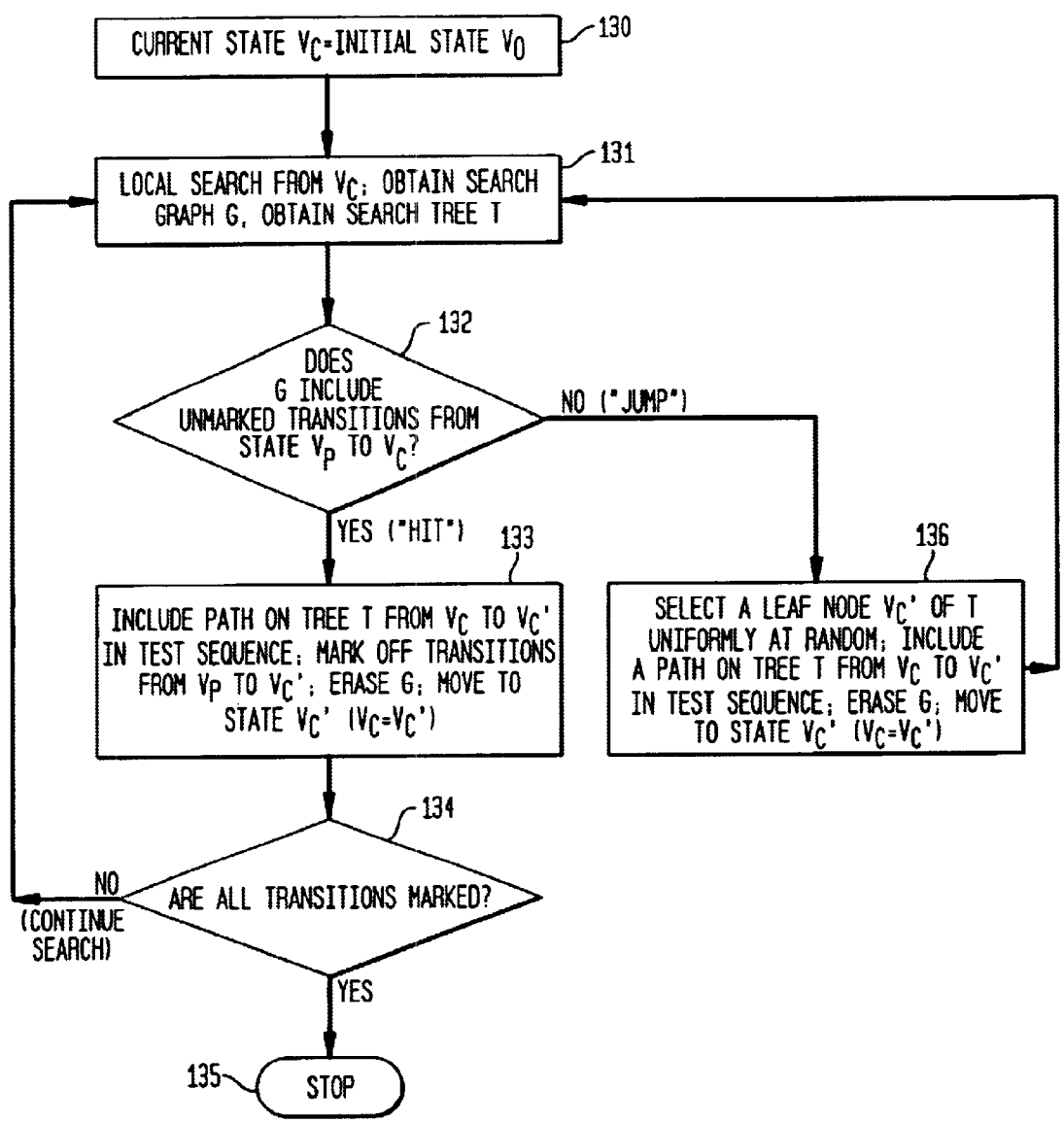
FIG. 13 illustrates a flowchart describing the "Hit-or-Jump" method according to the present invention.

FIG. 1 illustrates the extended finite state machine (EFSM) intercommunication according to the present invention, where C is the environment EFSM, A is the specification EFSM under test, and B is the implementation of A. Machine C and A(B) communicate synchronously. A is represented in the context of C by the following notation: C×A. There is a need to test the conformance of B to A in the context of C where C and A are known, and B is a "black-box". It should be noted that C×A may not be minimized or strongly connected even if C and A are. Also they can be partially (incompletely) specified.

Under a preferred embodiment, deterministic EFSM's are used to model system components, which include the environment, the components under test and their implementation. It is understood that the technique can be adapted to other mathematical models, such as Transition Systems, Petri Nets and Labeled Transition Systems. Under the preferred embodiment, an EFSM is defined as a quintuple M:

$$M=(I,O,S,x,T)$$

where I,O,S,x and T are finite sets of input symbols, output symbols, states, variables, and transitions, respectively. Each transition t in the set T is a 6-tuple, defined as:

$$t=(s_t, q_t, a_t, o_t, P_t, A_t)$$

where $s_t$, $q_t$, $a_t$, and $o_t$ are the start (current) state, end (next) state, input, and output, respectively. $P_t(x)$ is a predicate on the current variable values and $A_t(x)$ defines an action on variable values.

Initially, the machine is in an initial state $s^{(0)} \in S$ with initial variable values: $x^{(0)}$. At some point, the machine attains state $s_t$, with the current variable values x. Upon input $a_t$, if x is valid for $P_t$, i.e., $P_t(x)$=TRUE, then the machine follows the transition t, outputs $o_t$, changes the current variable values by action $x:=A_t(x)$, and moves to state $q_t$.

For each state $s \in S$ and input $a \in I$, all the transitions with start state s and input a can be configured to be $t_i=(s, q_i, a, o_i, P_i, A_i)$, with $1 \leq i \leq r$. In a deterministic EFSM, the set of valid variable values of these r predicates are mutually disjoint, i.e., $X_{Pi} \cap X_{Pj}=0$, $1 \leq i \neq j \leq r$. Otherwise, the machine becomes nondeterministic. In a deterministic EFSM, there is at most one transition to follow at any moment, since at any state and upon each input, the associated transitions have disjoint variable values for their predicates and, consequently, current variable values are valid for at most one predicate. Alternately, in a nondeterministic EFSM there may be more than one possible transition to follow.

There are two types of communications among the system components: (1) Synchronous communication by rendezvous without channels between; and (2) Asynchronous communication with channels between system components. Channels can be bounded or unbounded and both can be modeled by EFSM's. The interactions between the channels and system components are synchronous. Alternately, an additional variable can be used to "encode" different system components. Thus the whole environment can be modeled, including the channels to and from the system component under test, as one EFSM that communicates with the system component synchronously. It is understood that extended finite state machine have the same computing power as a Turing machine.

In general, it is not always possible to test for isomorphism of embedded components, even in the case of finite state machines (FSM's). Assuming that A and B are FSM's, machine isomorphism may be designated by A≅B. Furthermore, B≅A implies that C×B≅C×A. However, the converse is not true in general. For example, in FIG. 1, a and b are external inputs, 0 and 1 are external outputs, and x, y, t, u are internal input/outputs. As stated previously, C×B≅C×A. However, B≠A. Therefore, it becomes impossible to test A B in the context of C.

In practice, it is desired that B "behave correctly" in the context of C. That is, C×B≅C×A. Therefore, the problem is reduced to testing if C×B≅C×A. However the real goal is to test the component A, assuming that the environment machine C is correctly implemented. Suppose that A is tested in isolation. It would then be desirable to test all the transitions of A. That is, a testing sequence should be developed so that all the transitions of A are exercised. Similarly, in embedded testing, test sequences should be obtained (with external inputs) so that all the transitions of the component A are exercised. Specifically, tests are derived for C×A so that all the transitions of A are tested. Furthermore, different coverage of A may be desired that differs from the testing of all the transitions. As an example, the boundary values of the variables may be a test object. In such an instance, a test sequence for C×A is generally obtained for testing the component A in the context of C, so that the component machine A is covered according to a pre-specified criterion. It is assumed in this instance that C is correctly implemented; as such, the coverage of C would not be an issue.

It should be pointed out that in the above example, the systems may or may not have reset. EFSM's with reset transitions may be considered as a special case by inserting a reset edge from each state to the initial state, independent of the variable values. For the sake of brevity, only machines without reset will be considered in the disclosure.

A further consideration in the example is the existence of livelock and deadlock in the system. Livelock in C×A is a loop without external inputs, and it is reachable from the initial state. When the system C×A gets into a livelock, it will loop around indefinitely without any external inputs and may or may not produce external outputs. Under such circumstances, C×A can "move-on" by itself without any external control, and the external tester cannot drive the system C×A further to fulfill the testing task. This is undesirable system behavior in terms of embedded testing. Another undesirable system behavior is deadlock. During test generation, if a sink node is found (no outgoing transition) in C×A, the process is aborted, a "deadlock detected" is declared. In the system architecture, both livelock and deadlock are to be checked for system designs, during protocol validation and verification research. It is assumed in the below discussion that the system under consideration C×A is free of livelock and/or deadlock.

In using the "Hit-or-Jump" method and system, three related methods are factored during the execution of a "Hit-or-Jump". They include (1) a structured algorithm, (2) random walk, and (3) guided random walk. Generally, a goal of the invention is to cover all the transitions of the component machine under test. Furthermore, different tests may be generated to invoke different coverages—the modifications can be implemented simply through the use of different markings.

1. Structured Algorithm

From the initial state, a test sequence is generated so that all the transitions of component machine A are covered at least once. The algorithm includes three steps: (1) assign a distinct color (transition) to each transition of A; (2) construct a reachability graph of C×A where each edge of C×A is marked with a color from A if it is derived from that transition of A; (3) from the initial node of C×A, find a path of minimal length such all the colors are covered at least once. By using this structure, the "Rural Postman" problem to this covering path problem can be reduced (i.e., the problem is NP-hard). There are various heuristic procedures for solving this problem.

However, these algorithms require the construction of the reachability graph of C×A. It is often impossible in practice to construct such implementations due to the state explosion. Consequently, unstructured algorithms such as random walks are considered, which do not require the construction of reachability graphs.

2. Random Walk

The process is started from the initial node $(S_C^{(0)}, S_A^{(0)}, x^{(0)})$ where $S_C^{(0)}, S_A^{(0)}$, and $x^{(0)}$ are the initial state of C and A and initial variable values, respectively. Among all the possible outgoing edges in the reachability graph from the initial node, one edge is selected uniformly at random, and followed to the next node in the reachability graph. For example, if after k steps we arrive at a node $(S_C^{(k)}, S_A^{(k)}, x^{(k)})$, then all the outgoing edges are examined from this node and one edge is selected (uniformly at random) to follow. Meanwhile, if there are colors associated with the chosen edges that have not been marked (exercised), they are marked off. The process is then repeated until all the colors are marked off. The items that are kept track of during the walk for the test sequence are limited to: (1) The current node $(S_C^{(k)}, S_A^{(k)}, x^{(k)})$; (2) The colors that have not been marked off; and (3) The edges that have been walked through with the associated external I/0 sequence. There is no need to construct a whole reachability graph of C×A.

3. Guided Random Walk

This procedure is the same as the random walk described above, with some exceptions. When a node is arrived at $(S_C^{(k)}, S_A^{(k)}, x^{(k)})$, the outgoing edges are classified under the following: (1) with transitions of A involved, some of which are not marked; (2) With transitions of A involved and all of them are marked; and (3) Without any transitions of A involved. If the set (1) is not empty, we select one uniformly at random and follow that edge; otherwise if (2) is not empty, we select one uniformly at random and follow that edge; and, finally, if none of the above is true, (3) must be non-empty, and we select one uniformly at random and follow that edge. Guided random walks favor transitions of the embedded component under test, and among them give first priority to the transitions that have not been tested.

"Hit-or-Jump" Method and System

The "Hit-or-Jump" method and system avoids the aforementioned problems of random walk without the construction of a reachability graph. It further does not require a construction of a reachability graph of C×A either, and performs better than pure random walks. The functionality of "Hit-or-Jump" by itself is best seen through an examination of the initial condition, execution and termination of the algorithm performing the tasks:

1. Initial condition

The environment machine C is in an initial state $S_C^{(0)}$, while the component machine under test A is in initial state $S_A^{(0)}$, and the system variables have initial values $x^{(0)}$. It is understood that the initial states and variable values refer to the information known to he tested, and they are not necessarily the states and variable values after a system reset, which is often difficult to obtain in practice.

2. Execution

1. "Hit"

From the current node $(S_C^{(k)}, S_A^{(k)}, x^{(k)})$ conduct a search (depth-first or breadth-first) in C×A until:
  (a) An edge is reached that is associated with unmarked colors (transitions) of the component machine A, in accordance with a local search graph (a "Hit"). Then:
    i. Include the path from the current node to the edge (inclusive) in the test sequence under construction;
    ii. Mark off the newly exercised colors (transitions) of A;
    iii. Arrive at a node $(S_C^{(k+1)}, S_A^{(k+1)}, x^{(k+1)})$;
    iv. Erase the searched graph;
    V. Repeat from 1. or
  (b) Reaching a search depth or space limit without hitting any unmarked colors (transitions) of A. Then move to 2.

2. "Jump"
  (a) Constructing a search tree, rooted $(S_C^{(k)}, S_A^{(k)}, x^{(k)})$.
  (b) Examine all the leaf nodes of the tree, and select one uniformly at random.
  (c) Include the path from the root to the selected leaf node in the test sequence.
  (d) Arrive at the selected leaf node $(S_C^{(k+1)}, S_A^{(k+1)}, x^{(k+1)})$ (a "Jump")
    1. Repeat from 1.

2. Termination

The algorithm terminates when all the colors (transitions) of A have been marked off.

An embodiment of the invention can be further seen in FIG. 13. When the "Hit-or-Jump" testing is initiated 130, the current state is set equal to the initial state. A local search is conducted 131 from the current state $V_C$, where a local search graph is obtained (FIG. 13, G), as well as a search tree (FIG. 13, T), which contains a number of leaf nodes. When the local search graph G is analyzed 132, the invention determines whether there are any unmarked transitions existing from a previous state $V_p$ to a current state $V_C$.

If an unmarked transition is found (a "Hit"), a path is included on the tree T from the current state $V_C$ to the found state $V_{C'}$. At this point 133, the transition from the past state $V_p$ to the current found state $V_{C'}$ is marked off, the local search graph G is erased, and the test moves to the found state. Once the test moves to the found state, the found state $V_{C''}$, becomes the current state $V_C$. The test then queries whether all the transitions are marked 134. If all the transitions are found to have been marked, then the test terminates 135. If a transition is found not to be marked, then the test repeats the process from 131, where a new local search graph G is obtained.

If test 132 determines that there are not any unmarked transitions existing from a previous state $V_p$ to a current state $V_C$, the test moves to 136 ("Jump"), where a leaf node $V_{C''}$ of the search tree T 131 is chosen uniformly at random. A path is then included on tree T from the current node $V_C$ to the leaf node $V_{C''}$ in the test sequence. The local search graph G is then erased, and the test moves to state $V_{C''}$, and the state $V_{C''}$ is set as the current node $V_C$.

The above description describes an embodiment of the basic Hit-or-Jump method and system. There are further variations that may be implemented from the basic method disclosed above. Some of the variations and/or additions are described below.

One variation incorporates the principles of a guided "Hit-or-Jump". For the "Jump" described above, a leaf node of the locally searched graph (tree) is selected uniformly at random and the process proceeds from there. However, certain priorities can be enforced in selecting the leaf nodes, much like a Guided Random Walk (described above). For instance, the outgoing edges can be examined from each leaf node and classified with a priority: (A) with transitions of A involved, some of which are not marked; (B) with transitions of A involved and all of them are marked; and (C) Without any transitions of A involved. A "guided Jump" is then conducted according to the leaf node priorities (as in a Guided Random Walk).

Another variation can be made regarding space requirements. Often the environment machine C (and also A) is very large. It is thus impossible to construct a reachability graph of C, A, or C×A. The present invention does not need any of these graphs. As a result, for each "Hit" or "Jump" step, a local search graph is constructed on-line, where the local search graph is a subgraph of C×A. This can be accomplished by a Depth-first search, for instance. The size of the subgraph, hence the space requirement, is determined by the users, and is independent of the machines A and C. When constructing a search tree on-line, the internal transitions of C×A can be compressed to further save space.

A further variation may be made with regard to the fault models. A general procedure may be implemented that is independent of any fault models. Only component machine A is covered, and the procedure can also be used for test generation associated with fault models.

Yet another variation may be implemented concerning coverage. Under a preferred embodiment, all the transitions of A are covered. However, the algorithm can also be extended to: (1) Covering some (not necessarily all) transitions of A, which are specified by users or the testers; (2) Covering some states of A; and (3) Covering some transitions and states of A along with specified variable values such as boundary values. A distinct color can be assigned to each entity to be covered, and run "Hit-or-Jump" until all the colors are covered.

Yet another variation may be implemented concerning local testing. Local testing is a search conducted in a component machine with very restrictive assumptions (reducing to testing isolated machines). "Hit-or-Jump" conducts a local search within C×A without any assumption on A or C.

When the "Hit-or-Jump" method and system is implemented in another embodiment of the present invention, a software tool is developed that also drives an ObjectGEODE simulator. In this embodiment, the simulation is used in exhaustive mode for the implementation. In order to maximize the effectiveness of the embodiment, the advantages and limitations of the ObjectGEODE simulator were taken into account. The main features and limitations can be seen as follows:

1. A simulation in exhaustive mode can be stopped on a condition. A stop condition is a boolean expression. If during the simulation it becomes true, then the simulator stops. In this case two files can be obtained: one containing the partially deployed automaton and another one with the scenario (in a file whose extension name is .bl.scn). If the simulation is actually completed, these two files are available as well.
 2. A stop condition may be a disjunction of other stop conditions (thus modeling a set of conditions). In case it becomes true in the middle of simulating, the verdict (the result) will not point out all the conditions in the disjunction that have become true.
 3. A scenario is a series of signal inputs (a sequence) fired by the simulator from the initial state, aiming at achieving the exhaustive simulation of the specification. Each SDL state from which the input is accepted by the SDL process is given in the scenario.
 4. A deployed automaton corresponds to the contents of the file associated to the simulator's variable "edgesAump" in an exhaustive mode. This automaton is logically an FSM, and contains hooks to the SDL specification (and to the scenarios), and the SDL values (local variables and signal arguments) have been instantiated, either partially (interrupted simulation) or fully (exhaustive running).
 5. Each simulation in exhaustive mode produces a new deployed partial automaton; when an interrupted simulation is resumed a new partial automaton is produced, which generally has nothing to do with the previous one. Nevertheless the newly produced scenario includes the previous one: this property along the simulations will be the Ariadne's clue.
 6. It is possible to make the exhaustive simulation to be a depth-first search (DFS) or a breadth-first search (EFS) in the SDL specification, and to stop it on a depth limit value. In this last situation, a scenario is not obtained.

The aim is to get a unique sequence in the fully deployed automaton, corresponding to a path starting at the initial state that contains all the transitions of the embedded component under test yet without constructing the fully deployed automaton. The tool needs the following command-line options to interface the method and system:

sdl SPEC.pr: This input file is the protocol specification in SDL textual syntax. It must not be empty.

stop SPEC.stop: This input file contains a disjunctive stop condition, modeling the set of the embedded system component transitions. It defines the embedded system and hence must not be empty.

depth-lim 1: The given positive integer 1 is a depth limit that will be passed to the simulator; we stop when a search (DFS or BFS) reaches a depth of 1.

feed SPEC.feed: This input file only contains the inputs that the simulator can fire from the environment in order to stimulate the whole system. Hence no input of the embedded component appears in this file. It may be empty only if SPEC.scn is not (see below).

init SPEC.init: This input file only contains protocol-dependent variable initializations for the simulator ("let" clauses). It may be empty.

scn SPEC.scn: This input file contains an initial scenario only made of to-be-fired transitions for the embedded systems (in order to directly stimulate them, since they have no connection with the environment and hence have no associated feed clauses). It may be empty only if SPEC.feed is not (see above).

seq SPEC.seq: This output file contains a test sequence for the embedded system component. The sequence is a series of pairs of inputs and outputs.

The first step of the tool is to configure and produce three start-up files that will be used to drive the simulator:

1. main.startup: loads SPEC.feed, the initial conditions (SPEC.init), the current scenario, and specifies the exhaustive and DFS mode, together with the depth limit value (1).
2. stopsearch.startup: this file is devoted to the identification of the stop condition in the disjunction (initially in SPEC.stop) that actually interrupted the simulation, and thus works-around the aforementioned "stop condition" limitation of ObjectGEODE mentioned previously (item 2).
3. final.startup: It loads SPEC.feed and replays the final scenario obtained after hitting all the colors (transitions) of the embedded system component in order to make ObjectGEODE output a SPECJog file, from which the test sequence is extracted(into SPEC.seq).

The simulation is started with the main.startup file. There are two possible situations:

(1) The simulator outputs a SPEC.bl.scn file. This file is output if and only if an uncovered transition of the embedded system is "Hit" (see stop condition feature of ObjectGEODE above, item 1)). The simulator is then run again with the stop_search.startup file in order to identify the stop condition that corresponds to the Hit transition among the current disjunction (i.e., the set of uncovered transitions). This start-up drives a dichotomous search in the following way: Let E be the set of the candidate stop conditions.

There are only two possible cases:

1) E is a singleton.
   Then there is no ambiguity in this case. The "Hit-or-Jump" process has successfully completed. The simulator is then run with the final.startup file (see above) and extract from the SPEC.log the test sequence.
2) E has at least two elements.
   In this case, E is divided into two non empty sets $E_1$ and $E_2$ with approximately the same cardinality. One step is "undone" in the current scenario and a simulation is subsequently started with $E_1$ in BFS mode with a depth limit of two. The simulator is configured to build all the transitions starting at the previous state where it stopped. Only two cases can occur:
   i. The simulator stops at depth 1
      This means that the transition of the component is "Hit" again under test because it did not try to build the deployed automaton until depth two (and it was not known that the sought-after transition was at depth one). Thus the transition to be Hit belongs to the subset $E_1$. The search is then resumed with $E_1$ instead of E.
   ii. The simulator stops at depth 2
      This means that the deployed automaton is built at depth two—therefore the transition to be Hit is not encountered (it was known that the transition was at depth one). Therefore, the sought-after transition does not belong to $E_1$. The search is resumed with $E_2$ instead of E.

Note: The cost of this dichotomous search is logarithmic in the number of stop conditions in the disjunction.

(2) The simulator does not output a SPEC.bl.scn file. This means that the simulator stopped after reaching the depth limit 1. In other words, the simulator did not find any transition that satisfies one of the stop conditions in the disjunction. Thus a "Jump" is to be made.

However, a file may be generated that contains the partially deployed automaton as a result of the interrupted simulation, wherein the current state in the EFSM (SDL specification) and/or the path from the initial state is not known (see features and limitations of ObjectGEODE above, items 3, 4 and 6). In such a case the deployed automaton is parsed and a DFS is conducted on it. A leaf node is then chosen uniformly at random and a path (preferably the shortest) is found for the current state to the selected leaf node. The path is then appended at the end of the constructed scenario, and the simulation is resumed.

A further embodiment exists of the "Hit-or-Jump" method and system is disclosed as occurring on a network system, shown in FIG. 2, where the invention is applied to Intelligent Network (IN) telephone services. All of the features in the system (FIG. 2) are serially and communicatively coupled in the system. The Network block 200 is composed of two blocks: the Basic Call Service (BCS) 201, and a Features Block (FB) 202 that represents those services. The BCS block contains three processes that are typically implementing software: the Call Manager 207, the Call Handler 206 and the Feature Handler 205. The Call Manager 207 is responsible for the management of a call and controls the Call Handler 206 and the Feature Handler 205. The Call Handler 206 takes charge of a call, while the Feature Handler 205 provides access to the services while being connected to the Feature Manager 212, located in the Feature block 202.

The Feature block 202 is composed of five processes that represent the services: the Call Forward Unconditional (CFU) 208, the Call Forward on Busy Line (CFB) 209, the Automatic Call Back (ACB) 210, the Originate Call Screening (OCS) 211, and the Feature Manager 212. The Feature Manager 212 controls the remaining features 208–211 in the Feature Block 202 and further establishes a link between the Feature Handler 205 and the services. A Black List can be instantiated twice in order to obtain a black list on calls start, OCS services, and a black list at calls arrival (Terminal Call Screening (TCS), not shown).

As stated previously, the service integrates supplementary services including OCS 211 (see also FIG. 9), Terminal Call Screening (TCS), CFU 208 (see also FIG. 10), CFB 209 and ACB 210. The system has been described using the SDL language regarding call treatment, service invocation and user management. The system is located at the Global Functional Plane (GFP), while taking some concepts of the Distributed Functional Plane (DFP). It consists of different functional entities that are represented by the Network block.

The model can be configured to allow the execution of different calls in parallel, as well as calls initiated by the network. The environment (i.e., the users), are also modeled as SDL process instances that comprise the Users Block 204. The user process represents a combination of a phone line, a terminal and a user. It is relatively complete with respect to the service-usage life-cycle, with user-activations, deactivations, updates and invocations all modeled therein.

In order to provide a general idea of the complexity of the SDL system specifications, FIG. 2 illustrates the global architecture of the system, while in FIG. 3 discloses some relevant metrics. The global system can be simulated using exhaustive simulation in a mode that obtains the complete reachability graph. FIG. 4 illustrates some information concerning the numbers of states, transitions, etc, obtained after a manual stop of the exhaustive search/simulation. The reachability graph is not constructed herein due to the formidable state space requirement of the system.

The invention disclosed in this embodiment is executed on the OCS service module, which is a system component that is embedded in the Features Block and does not possesses any link with the environment. For the embedded testing of this module, each of the branches should be traversed at least once. Stop conditions are used to represent the characteristics of each branch. To distinguish each branch of the component, the stop conditions are hand-crafted. FIG. 5 illustrates the stop conditions of OCS module.

In order to perform the simulation of the system, a startup is configured that plays the role of the environment. It starts each process by firing the first transition. Next, some variables and services are initialized. These include services and actions capable of being invoked by subscribers (e.g., hangups, activations, disactivations, normal dialing). In this embodiment, the variables are set at approximately 80 actions for each user. The results are shown in FIG. 6. It should be noted that, in the worst case, when finding the stop condition input add_list_elmnt to blacklist and output msg_info from blacklist (FIG. 6, stop #6), the simulator will have only passed through 103 transitions. When this is compared to the metrics of the complete specification after a manual stop of the search/simulation (FIG. 4) it becomes evident that the "Hit-or-Jump" algorithm effectively finds untested transitions without constructing the reachability graph. Furthermore, the total test sequence is short; the time corresponds to the CPU real-user time (Sun Sparc Ultra-1).

Once all the transitions of the embedded component OCS module have been traversed, a single test sequence is obtained, which corresponds to the total path that has been traversed from the environment to the last transition of the module. The obtained sequence of transitions in this embodiment is 150; in other words, only 150 transitions need to be taken to cover the whole OCS module in the context. The segment of the sequence in FIG. 7 exhibits the invocation of services, while FIG. 8 shows a series of transitions that allow the transition of the embedded module to be reached in the case of the stop output ready (see FIG. 6, stop #3). The complete test sequence of 150 transitions that cover the whole embedded OCS service module is in the Appendix. An identical test performed under a Random Walk (see above) generates a test sequence of 1402 transitions. When the two methods are compared, it is clear that "Hit-or-Jump" produces a test sequence with a same fault coverage as a Random Walk but is an order of magnitude shorter.

The "Hit-or-Jump" method and system can additionally be performed on the embedded testing of the service CFU. Moreover, the "Hit-or-Jump" method and system can also be applied to the process Responder of the INRES protocol (see FIG. 11 and 12). Various test sequence lengths have been obtained with different mode of search, BFS (Breath-first-search), DFS (Depth-first-search), Merge (a DFS and then a BFS), and a Random Walk.

Although exemplary embodiments of the invention have been described in detail above, it is understood that many additional modifications are possible in the exemplary embodiments without departing from the spirit and scope of the invention. For example, the method and system can be adapted to other mathematical models such as transition systems and labeled transition systems, and can also be adapted to embedded testing of systems specified by other languages such as LOTOS and ESTELLE. The system can also be implemented to conduct Internet Protocol testing.

Other variations or generalizations can also be implemented. For instance, if there has been no Hit for a large number of Jumps, one might "backtrack" to the previous Hit, and Jump to a different node to proceed with testing. Furthermore, various depth values may be used; a larger depth value increases the probability of hitting an uncovered part of the component under test. However, it may require more space and time for each step. A long "Jump" implies a longer subsequence in the test for this step. These modifications would it depend on the system under test to choose a good depth value. As indicated earlier, one can always choose a depth value that is within the limit of affordable memory space.

Appendix

A complete test sequence of 150 transitions that cover the whole embedded OCS service module in an Intelligent Network appear as follows:

des (0, 150,151)
(0, "NULL/started_acb", 1)
(1, "NULL/started_cfb",2)
(2, "NULL/started_cfu", 3)
(3, "NULL/started_b1",4)
(4, "NULL/started_b1", 5)
(5, "started_acb/NULL",6)
(6, "started_cfb/NULL",7)
(7, "started_cfu/NULL",8)
(8, "started_b1/NULL",9)
(9, "started_b1/user started",10)
(10, "NULL/user_started",11)
(11, "NULL/user_started", 12)
(12, "NULL/user_started", 13)
(13, "NULL/user_started", 14)
(14, "user_started/user_started_ack", 15)
(15, "user_started/user_started_ack",16)
(16, "user_started/user_started_ack", 17)
(17, "user_started/user_started_ack", 18)
(18, "user_started/user_started_ack", 19)
(19, "user_started_ack/NULL", 20)
(20, "user_started_ack/NULL", 21)
(21, "user_started_ack/NULL", 22)
(22, "user_started_ack/NULL", 23)
(23, "user_started_ack/schedule_user_[true],", 24)
(24, "schedule_user[true]/offhook", 25)
(25, "offhook/dial_tone",26)
(26, "dial_tone/feature_op[ocs,updat]", 27)
(27, "feature_op [ocs, updat]/user_trigger[ocs , updat, 1, 1]", 28)
(28, "user_trigger[ocs,updat, 1,1]/update[ocs,1,user(1)]", 29)
(29, "update[ocs,1,user(1)]/update[ocs,1,user(1)", 30)
(30, "update [ocs, 1 ,user (1)]/ready", 31)
(31, "ready/add_list_elmnt[1]", 32)
(32, "add_list_elmnt [1]/feature_op_ok", 33)
(33, "feature_op_ok/onhook", 34)
(34, "onhook/cut_connection",35)
(35, "cut_connection/cut_connect [ocs]", 36)

(36, "cut_connect[ocs]/cut_connection", 37)
(37, "cut_connection/cut_connect_ack", 38)
(38, "cut_connect_ack/cut_ack",39)
(39, "cut_ack/cut_connect_ack", 40)
(40, "cut_connect_ack/net_trigger[o_end_call 1, 1,1]", 41)
(41, "net_trigger[o_end_call, 1,1]/resume_call"o_end_call, disconnecting, "1, 1]", 42)
(42, "resume_call [o_end_call, disconnecting, 1, 1]/end_leg[1, 1]", 43)
(43, "end_leg[1, 1]/line_free",44)
(44, "line_free/user_ack", 45)
(45, "user_ack/cm_ack",46)
(46, "cm_ack/handler exit[call_handler(1)]", 47)
(47, "handler_exit[call_handler(1)]/schedule_user [true]", 48)
(48, "schedule_user [true]/offhook",49)
(49, "offhook/dial tone", 50)
(50, "dial_tone/dialled [2]", 51)
(51, "dialled[2]/net_trigger[addressed, 1,2]", 52)
(52, "net_trigger[addressed,1,2]/invoke[ocs,1, 2,user(1) ,addressed]", 53)
(53, "invoke[ocs,1,2,user(1) ,addressed]/invoke[ocs, 1, 2 user(1), addressed]", 54)
(54, "invoke[ocs,1,2,user(1), addressed]/continue",55)
(55, "continue/continue", 56)
(56, "continue/resume_call [addressed, connecting, 1,2]", 57)
(57, "resume_call [addressed, connecting, 1 , 2]/net_trigger [analysed, 1,2]", 58)
(58, "net trigger[analysed,1,2]/invoke[cfu,1,2,user(1) , analysed]", 59)
(59, "invoke[cfu,1,2,user(1) , analysed]/invoke[cfu,1,2,user(1),analysed]", 60)
(60, "invoke[cfu,1,2,user(1),analysed]/proceed[3]", 61)
(61, "proceed[3]/proceed [3]", 62)
(62, "proceed[3]/resume_pall [analysed,completing, 1,3]", 63)
(63, "resume_call [analysed, completing, 1,3) /phonestat_req [1,3]", 64)
(64, "phonestat_req[1,3]/called_isfree[user(3)]", 65)
(65, "called_isfree [user (3)]/ringback_tone", 66)
(66, "ringback_tone/user_ack",67)
(67, "user_ack/ring_start", 68)
(68, "ring_start/user_ack", 69)
(69, "user_ack/net_trigger[completion, 1,3]", 70)
(70, "net_trigger[completion, 1,3]/resume_call [completion, ringing, 1,3]", 71)
(71, "resume call[completion, ringing, 1 ,3]/action[false]", 72)
(72, "action[false]/user_ack", 73)
(73, "user_ack/action[false]", 74)
(74, "action [false]/offhook", 75)
(75, "offhook/call_completed", 76)
(76, "call_completed/conv_caller", 77)
(77, "conv_caller/call_completed", 78)
(78, "call_completed/conv_called", 79)
(79, "conv_called/net_trigger [acceptance, 1 , 3]", 80)
(80, "net_trigger[acceptance, 1,3]/resume_call[acceptance, call_in_progress,1,3]", 81)
(81, "resume_call [acceptance, call_in_progress ,1,3]/call_suitch", 82)
(82, "call_switch/schedule_user [true]", 83)
(83, "schedule_user [true) /offhook", 84)
(84, "offhook/dial_tone", 85)
(85, "dial_tone/dialled[1]", 86)
(86, "dialled[1]/net_trigger[addressed,5,1]", 87)
(87, "net_trigger[addressed,5,1]/resume_call[addressed, connecting,5,1]", 88)
(88, "resume_call [addressed,connecting, 5, 1]/net_trigger [analysed, 5, 1]", 89)
(89, "net_trigger [analysed, 5, 1]/resume_call (analysed, completing, 5, 1]", 90)
(90, "resume_call[analysed ,completing,5,1]/phonestat_req[5,1]", 91)
(91, "phonestat_req[5 ,1)/called_isbusy[user(1)]", 92)
(92, "called_isbusy[user (1)]/net_trigger[occupation,5,1]", 93)
(93, "net_trigger[occupation,5,1]/resume_call[occupation, disconnecting, 5,1]",94)
(94, "resume_call[occupation, disconnecting,5, 1)/busy_tone", 95)
(95, "busy_tone/onhook",96)
(96, "onhook/net_trigger[o_end_call,5, 1]", 97)
(97, "net_trigger[o end_call,5,1]/resume_call[o_end_call,disconnecting,5, 1]", 98)
(98, "resume_call[o_end_call, disconnecting, 5,1]/end_leg[5,1]", 99)
(99, "end_leg [5,1]/line_free", 100)
(100, "line_free/user_ack", 101)
(101, "user_ack/cm_ack", 102)
(102, "cm_ack/handler_exit[call_handler (3)]", 103)
(103, "handler_exit [call_handler(3)]/schedule_ch", 104)
(104, "schedule_ch/action[true]", 105)
(105, "action [true]/onhook", 106)
(106, "onhook/net_trigger[t_end_call,1,3]", 107)
(107, "[net_trigger[t_end_call,1,3)/resume_call[t_end_call, disconnecting,1 ,3]", 108)
(108, "resume_call[t_end_call, disconnecting,1,3]/busy_tone", 109)
(109, "busy_tone/onhook", 110)
(110, "onhook/net_trigger[o_end call, 1, 3]", 111)
(111, "net_trigger[o_end_call,1,3]/resume_call[o_end_call, disconnecting,1,3]", 112)
(112, "resume_call [o_end_call ,disconnecting,1,3]/end_leg [1,1]", 113)
(113, "end_leg[1,1]/line_free", 114)
(114, "line_free/user_ack", 115)
(115, "user_ack/cm_ack", 116)
(116, "cm_ack/end_leg[3,1]", 117)
(117, "end_leg [3, 1]/line_free", 118)
(118, "line_free/user_ack", 119)
(119, "user_ack/cm ack",120)
(120, "cm_ack/handler_exit [call_handler(2)]", 121)
(121, "handler_exit[call_handler(2)]/schedule_user[true] ", 122)
(122, "schedule_user[true]/offhook", 123)
(123, "offhook/dial_tone", 124)
(124, "dial_tone/dialled[3]", 125)
(125, "dialled [3]/net_trigger [addressed, 1 , 3]", 126)
(126, "net_trigger[addressed,1,3]/invoke[ocs,1,3,user(1) ,addressed]", 127)
(127, "invoke[ocs,1,3,user(1) ,addressed]/invoke[ocs,1,3, user(1) , addressed]", 128)
(128, "invoke[ocs,1,3,user(1) , addressed]/clear call", 129)
(129, "clear_call/clear_call", 130)
(130, "clear_call/resume_call[addressed, disconnecting, 1, 3]", 131)
(131, "resume_call[addressed, disconnecting,1,3]/busy_tone",132)
(132, "busy_tone/onhook", 133)
(133, "onhook/net_trigger[o_end_call, 1,3]", 134)
(134, "net_trigger[o_end_call, 1,3]/resume_call[o_end_call, disconnecting, 1,3]", 135)

(135, "resume_call[o_end_call, disconnecting, 1,3]/end_eg [1, 1]", 136)
(136, "end_leg[1, 1]/line_free", 137)
(137, "line_free/user_ack", 138)
(138, "user_ack/cm_ack", 139)
(139, "cm_ack/handler_exit [call_handler(4)]", 140)
(140, "handler_exit[call_handler(4)]/schedule_user[true]", 141)
(141, "schedule_user[true]/offhook", 142)
(142, "offhook/dial tone", 143)
(143, "dial_tone/feature_op[ocs,updat]", 144)
(144, "feature_op[ocs ,updat]/user_trigger[ocs, updat, 1, 1]", 145)
(145, "user trigger[ocs ,updat, 1,1]/update[ocs, 1 ,user(1)]", 146)
(146) "update[ocs, 1, user(1)]/update[ocs, 1, user(1)]", 147)
(147, "update[ocs, 1 ,user(1)]/ready", 148)
(148, "ready/add list_elmnt[1]", 149)
(149, "add_list_elmnt[1]) /msg_info[already_in_list)", 150)

We claim:

1. A method of embedded testing of a component machine (A) in a system (C×A) comprising:
   A) searching a current node in a local search graph in the system (C×A) until:
   i. an edge transition is reached that is associated with unmarked transitions of the component machine (A);
      a) including a path from the current node to the edge transition in a test sequence;
      b) marking off an unmarked edge transition of the component machine (A) and moving to a new node;
      c) erasing the local search graph
      d) repeating the method in A) from the new node; or
   ii. a search depth or space limit is reached without hitting any unmarked transitions of (A);
      a) constructing a search tree, with at least one leaf node, and the current node as a root;
      b) examining said at least one leaf node of the search tree, and selecting one of said at least one leaf node as a new leaf node;
      c) including a path from the root to the leaf node, and moving to the new leaf node; and
      d) repeating the method in A) from the new leaf node.

2. A method as in claim 1, wherein the testing terminated when all transitions of component machine (A) have been marked off.

3. A method as in claim 1, where the search is conducted "Depth-First" or "Breath-First".

4. A method as in claim 1, wherein the path from the current node to the transition edge is inclusive.

5. A method as in claim 1, wherein (A) and (C) are extended finite state machines in a system (C×A).

6. A method of embedded testing of a component machine in a system comprising:
   a) searching a current node in a local search graph until (1) an edge transition is reached that is associated with unmarked transitions of a component machine, or (2) a depth or space limit is reached without hitting any unmarked transitions of the component machine; and
   b) including a path from the current node to the edge transition, marking off the unmarked transitions moving to a new node and erasing a searched graph if an edge transition is reached, or otherwise constructing a leaf node search tree with the current node as a root, selecting a new leaf node and jumping to the new leaf node.

7. A method as in claim 6, wherein the search is repeated until all transitions of the component machine have been marked off.

8. A method as in claim 6 wherein the testing of a component machine includes simulating at least one extended finite state machine.

9. A method as in claim 6, wherein the selected new leaf node exists on a frontier of the local search graph.

10. A method as in claim 9, wherein the searching includes marking off a newly exercised transition of the component machine.

11. A method as in claim 6 wherein the selecting of the new leaf node includes examining at least one leaf node of the leaf node search tree.

12. A method as in claim 6, wherein the selecting of the new leaf node is conducted uniformly at random.

13. A method as in claim 6, wherein the selecting of the new leaf node includes the path from the root to the leaf node.

* * * * *